United States Patent
Belson et al.

(10) Patent No.: US 7,280,365 B2
(45) Date of Patent: *Oct. 9, 2007

(54) MULTI-PROCESSOR MODULE WITH REDUNDANT POWER

(75) Inventors: Steven A. Belson, Plano, TX (US); Shaun L. Harris, Mckinney, TX (US); Eric C. Peterson, McKinney, TX (US); Gary W. Williams, Rowlett, TX (US); Christian L. Belady, Mckinney, TX (US); Jeffrey P. Christenson, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 276 days.

This patent is subject to a terminal disclaimer.

(21) Appl. No.: 11/061,156

(22) Filed: Feb. 18, 2005

(65) Prior Publication Data

US 2006/0187646 A1    Aug. 24, 2006

(51) Int. Cl.
*H05K 7/20* (2006.01)
(52) U.S. Cl. .................. 361/721; 361/690; 361/719; 361/785; 361/790; 257/707; 257/721; 165/80.3; 174/16.1; 174/16.3
(58) Field of Classification Search ............... None
See application file for complete search history.

(56) References Cited

U.S. PATENT DOCUMENTS

| | | | |
|---|---|---|---|
| 5,969,944 A * | 10/1999 | Borkar et al. ............... | 361/699 |
| 6,166,908 A * | 12/2000 | Samaras et al. ............ | 361/700 |
| 6,304,450 B1 * | 10/2001 | Dibene et al. ............. | 361/704 |
| 6,501,662 B2 * | 12/2002 | Ikeda ........................ | 361/760 |
| 6,554,654 B1 | 4/2003 | Stoddard et al. | |
| 6,556,455 B2 * | 4/2003 | Dibene et al. ............. | 361/785 |
| 6,771,507 B1 | 8/2004 | Belady et al. | |
| 6,801,431 B2 * | 10/2004 | Hartke et al. ............... | 361/704 |
| 6,807,061 B1 * | 10/2004 | Harris ....................... | 361/719 |
| 6,816,378 B1 | 11/2004 | Belady et al. | |
| 6,819,562 B2 | 11/2004 | Boudreaux et al. | |
| 6,975,518 B2 * | 12/2005 | Frutschy et al. ............ | 361/769 |

OTHER PUBLICATIONS

David A. Klein, U.S. Appl. No. 10/800,837, filed Mar. 15, 2004, entitled "Multi-Processor Module".

* cited by examiner

*Primary Examiner*—Boris Chervinsky

(57) ABSTRACT

One embodiment includes an electronic assembly having a first printed circuit board (PCB) and a second PCB having at least two processors. The second PCB is coupled to and disposed above the first PCB. A thermal dissipation device dissipates heat away from the processors. First and second power modules supply power to the second PCB and are separated and redundant power supplies such that upon failure of the first power module, the second power module can provide power for both power modules to the second PCB.

20 Claims, 5 Drawing Sheets

MULTI-PROCESSOR MODULE WITH REDUNDANT POWER

BACKGROUND

Some electronic systems utilize several printed circuit boards with many different electronic components interconnected to the circuit boards. As these electronic systems decrease in size and increase in performance, packing density, heat dissipation, and power distribution architecture become increasingly important.

As noted, packing density is one important criterion in many electronic systems. One way to reduce the actual size of an electronic device is to more closely position the electrical components together. Electrical components within a circuit board, however, are generally already tightly confined, and additional space may not be readily available. If, however, electrical components can be positioned to reduce the overall size of the electronic device, then significant savings and advantages can be realized.

Heat dissipation is also an important criterion in many electronic systems. Circuit boards may include a plurality of heat-generating devices that must be cooled in order to operate within a specified operating temperature. If these heat-generating devices are not sufficiently cooled, then the devices can exhibit a decrease in performance or even permanently fail.

As processor and memory technologies advance, power distribution architecture concurrently must evolve to meet demands of processors and memories. Designers consider many factors when developing power distribution architectures for electronic systems. For instance, one important consideration is supplying reliable power to processor circuit boards. If a power converter fails, for example, then power to an entire circuit board can be lost.

The design and layout of printed circuit board components can be quite complex and challenging. Designers must consider many important factors, such as packing density, heat dissipation, and power distribution architecture. Improvements in these areas can realize important benefits for electronic systems and devices.

SUMMARY

Embodiments in accordance with the present invention are directed to apparatus, methods, and systems for providing redundant power to multi-processor modules and circuit boards. In one exemplary embodiment, an electronic assembly has a first printed circuit board (PCB) and a second PCB having at least two processors. The second PCB is coupled to and disposed above the first PCB. A thermal dissipation device dissipates heat away from the processors. First and second power modules supply power to the second PCB and are separated and redundant power supplies such that upon failure of the first power module, the second power module can provide power for both power modules to the second PCB.

In another exemplary embodiment, a method comprises connecting first and second power systems to a first thermal dissipation device to form a power module; connecting plural processors and a second thermal dissipation device to a first circuit board to form a multi-processor module; connecting the multi-processor module and the power module to a second circuit board; generating redundant power to the multi-processor module from the power module such that the first power system provides sufficient power to the multi-processor module upon failure of the second power system; and dissipating heat away from both the first and second power systems with the first thermal dissipation device.

Other embodiments and variations of these embodiments are shown and taught in the accompanying drawings and detailed description.

DETAILED DESCRIPTION

Figure 1:
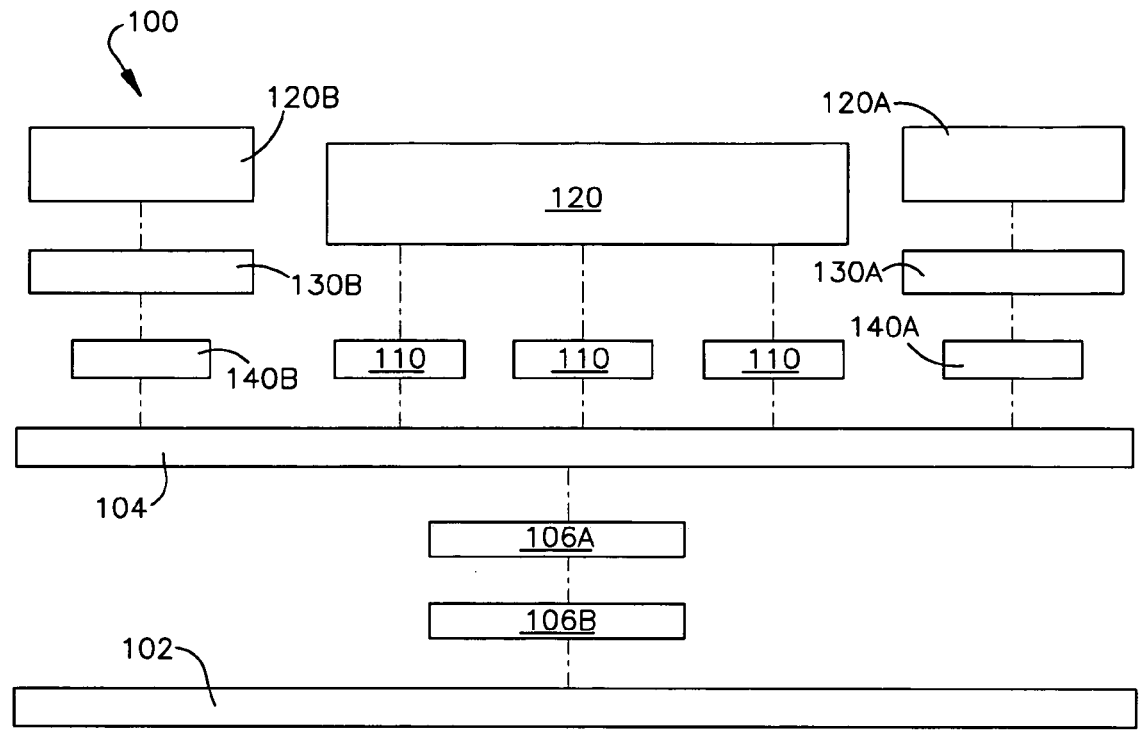
FIG. 1 is an exploded side view of a block diagram of an electronic assembly in accordance with an exemplary embodiment of the present invention.

FIG. 1 is an exploded side view of a block diagram of an electronic system or assembly 100 in accordance with an exemplary embodiment of the present invention. The electronic assembly 100 includes two printed circuit boards (PCB) or printed wiring boards (PWB) 102 and 104. The PCBs 102 and 104 can have a variety of configurations and still be within embodiments in accordance with the invention. By way of example, the PCBs can include power module circuit boards, voltage regulation module (VRM) circuit boards, controller boards (such as a special type of expansion board that contains a controller for a peripheral device), expansion boards (such as any board that plugs into an expansion slot of a computer), or modules. As another example, the PCB 102 can be a motherboard, and the PCB 104 can be a daughterboard.

A motherboard is a printed circuit board that can be used in a personal computer, server, or other electronic device. The motherboard (also known as a main board or system board) can provide attachment points for processors, graphics cards, sound cards, controllers, memory, ICs, modules, PCBs, and many other electronic components and devices in a computing system. The daughterboard can be utilized as an extension of the motherboard or other card or board. The daughterboard can have plugs, sockets, pins, connectors, or other attachments for the motherboard or other boards. Connectors 106A and 106B, for example, can be used to electrically couple the PCB 102 to the PCB 104. Connectors 106 provide a mechanical and electrical interface or connection between the PCBs and may include, for example, a removably connectable plug (male) and socket (female). Alternatively, a single connector or multiple separate connectors can be used to connect the PCBs 102 and 104.

The PCBs 102 and 104 include a plurality of electronic components or devices. For example, the PCB 104 includes a plurality of heat-generating components or devices 110. These heat-generating devices include any electronic component that generates heat during operation. For example, heat-generating devices include, but are not limited to, electronic power circuits, application specific integrated circuits (ASICs), processors (such as a central processing unit (CPU) or digital signal processor (DSP)), discrete electronic devices (such as field effect transistors (FETs)), other types of transistors, or devices that require heat to be thermally dissipated from the device for the device to operate properly or within a specified temperature range. An ASIC can comprise an integrated circuit or chip that has functionality customized for a particular purpose or application. The PCBs 102 and 104 can also include a plurality of electronic components or device that may or may not generate heat or that may generate low or insignificant amounts of heat. Examples of such devices include, but are not limited to, resistors, capacitors, transistors, diodes, memories, etc.

The electronic assembly 100 can include at least one thermal dissipation device 120. A thermal dissipation device includes, but is not limited to, heat spreaders, cold plates, refrigeration (evaporative cooling) plates, heat pipes, mechanical gap fillers (such as a plurality of pins, rods, etc.), or other devices adapted to dissipate heat. Further, such thermal dissipation devices include heatsinks. A heatsink is a component designed to reduce the temperature of a heat-generating device or component, such as heat-generating components 110. A heatsink, for example, can dissipate heat in a direct or indirect heat exchange with the electronic components, the heat being dissipated into surrounding air or surrounding environment. Numerous types of heatsinks can be utilized with embodiments in accordance with the present invention. For example, embodiments can include heatsinks without a fan (passive heatsinks) or heatsinks with a fan (active heatsink). Other examples of heatsinks include extruded heatsinks, folded fin heatsinks, cold-forged heatsinks, bonded/fabricated heatsinks, and skived fin heatsinks. Further, the thermal dissipation device, including heatsinks, can use liquids and/or phase change materials.

The electronic assembly 100 also includes multiple power supplies or power systems 130A, 130B. An electrical connector or coupling device 140A, 140B connects the respective power system 130A, 130B to the PCB 104. Each power system 130A, 130B can have a separate thermal dissipation device 120A, 120B.

The power systems 130A, 130B can be disposed at various locations on the PCB 104. For example, the power systems 130A, 130B can be located at opposite ends of the PCB 104, adjacent each other, horizontally stacked, or vertically stacked. Further, each power system and accompanying thermal dissipation device can be removably stacked or connected to the PCB 104.

The power systems 130A, 130B can include numerous embodiments for providing power to electronic components (such as heat-generating components 110) and/or PCBs (such as the PCB 104) within the electronic assembly 100. For example, the power system can be a factorized power architecture (FPA) module, a power converter, such as a direct current (DC) converter or DC-DC converter, AC-DC converter, DC linear regulator, DC switching regulator, or DC charge pump.

Looking now to FIGS. 1-5, power distribution architecture, thermal dissipation, and packing density are discussed in more detail for the electronic assembly 100.

The two powers systems 130A, 130B can share responsibility for providing power to the electronic system 100 and/or the PCB 104. For example, the power systems 130A, 130B may be redundant power systems. Redundant power systems can serve as a duplicate for preventing failure upon failure of one of the power systems. In other words, if one power system fails, then the other power system can supply sufficient power to the system to provide continuous and uninterrupted power to the system. As an example, if power system 130A fails, then power system 130B could provide sufficient power to the PCB 104 and corresponding heat-generating components 110. Alternatively, if power system 130B fails, then power system 130A could provide sufficient power to the PCB 104 and corresponding heat-generating components 110.

The two power systems 130A, 130B may also be modular and replaceable. In some embodiments, each power system 130A, 130B is an independently-operable unit that can be constructed with standardized units or dimensions for flexibility and replaceability for use in the electronic assembly 100. Further, each power system 130A, 130B can be connected to or removed from the electronic assembly (example, the PCB 104) without connecting, removing, or replacing other components in the electronic assembly 100 (example, the heat-generating components 110). By way of illustration, suppose that power system 130B fails or otherwise needs replaced or upgraded. The power system 130B and accompanying thermal dissipation device 120B can be disconnected and removed from the PCB 104 without removing or replacing the power system 130A, PCB 104, thermal dissipation devices 120, 120A and/or the heat-generating components 110. As another illustration, suppose that power system 130A fails or otherwise needs replaced or upgraded. The power system 130A and accompanying thermal dissipation device 120A can be disconnected and removed from the PCB 104 without removing or replacing the power system 130B, PCB 104, thermal dissipation devices 120, 120B and/or the heat-generating components 110. Further yet, either power module can be removed and/or replaced without electrically and mechanically disconnecting the PCBs 102 and 104.

The power systems can be disconnected and connected independent of each other and support hot-swapping (i.e., the ability to add and remove devices to and from a computer or electronic device while the computer or electronic device is running with the operating system automatically recognizing the changed or newly added component). For example, if power system 130B fails, then the power system module (power system 130B and thermal dissipation device 120B) can be removed from the PCB 104 while the electronic assembly 100 is running and continues to run without interruption. Power supply to the electronic system (for example, to PCB 104) can be continuous since power system 130A will automatically assume power supply responsibilities for power system 130B as soon as it fails and while it is disconnected or otherwise not functional.

Once connected, the PCB 102 is generally parallel to the PCB 104. The PCBs 102 and 104 are mechanically and electrically connected to form a vertical stacked-up configuration. In particular, the connectors 106A and 106B couple the PCBs together. The PCB 102 is separated from the PCB 104 by a distance approximately equal to the height or thickness of the connectors 106A and 106B when connected together.

Although PCBs 102 and 10 are shown to form a vertical stacked-up configuration, other configurations are also within embodiments in accordance with the present invention. For example, the PCBs 102 and 104 can be connected to form a horizontal stacked configuration or other configurations.

In one exemplary embodiment, a separate thermal dissipation device 120A, 120B is associated with (such as being located adjacent, in, or on) each power system 130A, 130B, respectively. Further, each thermal dissipation device 120, 120A, 120B can be independent of each other and function to cool its own respective module. Thus, thermal dissipation device 120 functions to cool heat-generating components 110; thermal dissipation device 120A functions to cool power system 130A; and thermal dissipation device 120B functions to cool power system 130B.

In another exemplary embodiment, the thermal dissipation devices 120A, 120b are not necessary to cool the power systems 130A, 130B. For example, both power systems 130A and 130B can be in the direct pathway of airflow created by the thermal dissipation device 120. The airflow pathway directed onto the power systems 130A, 130B can provide sufficient cooling so that the power systems do not require additional cooling or additional cooling devices in order to operate properly or within a specified or normal temperature range. In other embodiments, the power systems 130A, 130B do not require any thermal dissipation device in order to operate. As such, the power systems 130A, 130B may or may not require assistance to dissipate heat from the power systems or power modules.

In another exemplary embodiment, one or both of the power systems 130A and 130B can be cooled via direct heat exchange with the thermal dissipation device 120. For example, a single thermal dissipation device could extend to cover both power systems 130A, 130B. In other words, the same thermal dissipation device used to cool the heat-generating components 110 can also be used to cool or conduct heat from power systems 130A, 130B. Thus, the heat from both power systems can then be evacuated or dissipated from the thermal dissipation 120. For example, the thermal dissipation device 120 can extend around, at, above, adjacent, or below any one or numerous surfaces of the power systems 130A and 130B. For instance, a portion of the thermal dissipation device 120 can extend above the power systems. Further yet, an additional thermal dissipation device, such as a heat spreader, can be positioned directly above the power systems 130A, 130B to evacuate or dissipate heat away from the power systems. Alternatively, the thermal dissipation device can be mechanically and thermally coupled to the power systems in order to evacuate heat from the power systems.

In another exemplary embodiment, one or both of the power systems 130A and 130B can be cooled via either or both (1) direct heat exchange with a thermal dissipation device and (2) an airflow created by a thermal dissipation device. In one exemplary embodiment, a single thermal dissipation device, such as device 120, simultaneously cools or dissipates heat for both power systems 130A, 130B and heat-generating components 110 on the PCB 104. In another exemplary embodiment, each power system 130A, 130B is cooled from its own dedicated thermal dissipation device 120A, 120B.

In order to further increase the packing density or increase an effective use of space in the electronic assembly 100, the unused space 160 located between PCB 104 and PCB 102 (see FIG. 2) can be occupied with electronic components. Such electronic components can include heat-generating or non-heat-generating devices. Preferably, these components include non-heat-generating devices or low heat-generating devices, such as electronic components that do not require the use of a thermal dissipating device to operate properly. The unused space 160 can include the electronic components or elements associated with the power systems 130A, 130B. By way of example only, these components include, but are not limited to, pulse width modulation (PWM) devices, switches, bit tests (such as testing the value of specific bits in memory or registers), and bus architecture (such as 12C buses).

Figure 2:
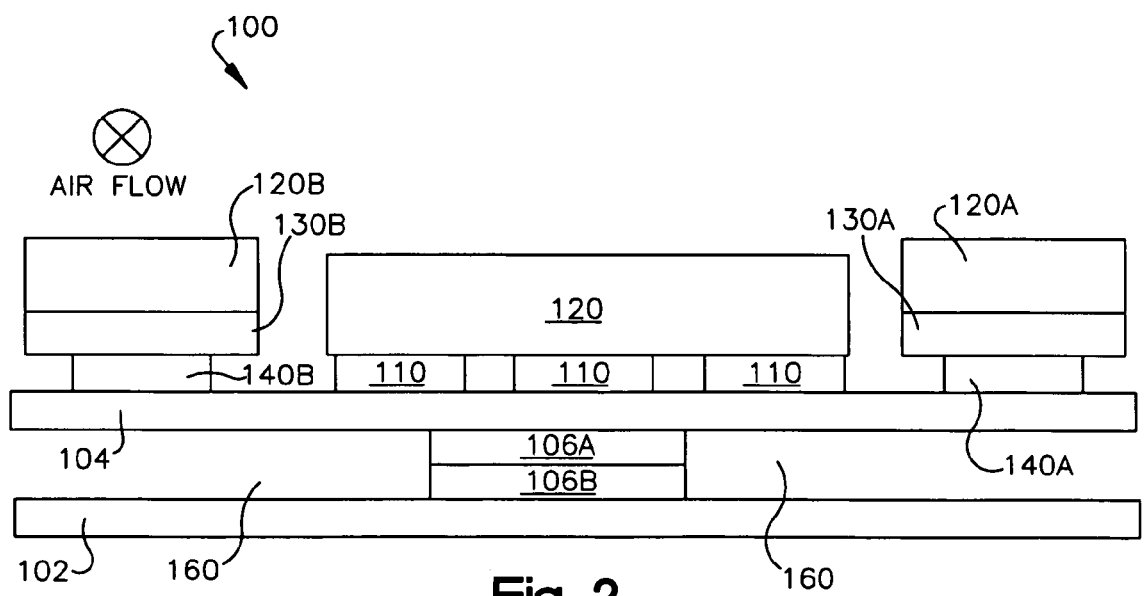
FIG. 2 is a side view of the electronic assembly of FIG. 1 with the electronic assembly being assembled together.

As best shown in FIGS. 2-5, the thermal dissipation device 120 is positioned directly above the heat-generating components 110 of the PCB 104. Further, the power systems 130A, 130B are positioned adjacent to opposite ends of the thermal dissipation device 120 and directly above the PCB 104. As shown in FIG. 2, the power systems 130A, 130B connect directly, via connectors 140A, 140B, to the PCB 104.

Figure 3:
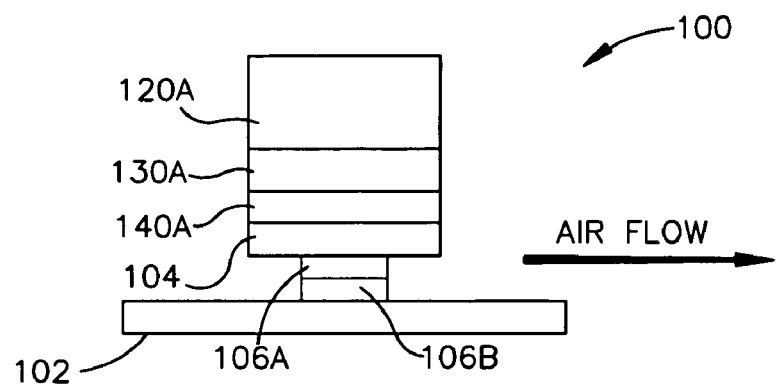
FIG. 3 is an end view of FIG. 2.
Figure 4:
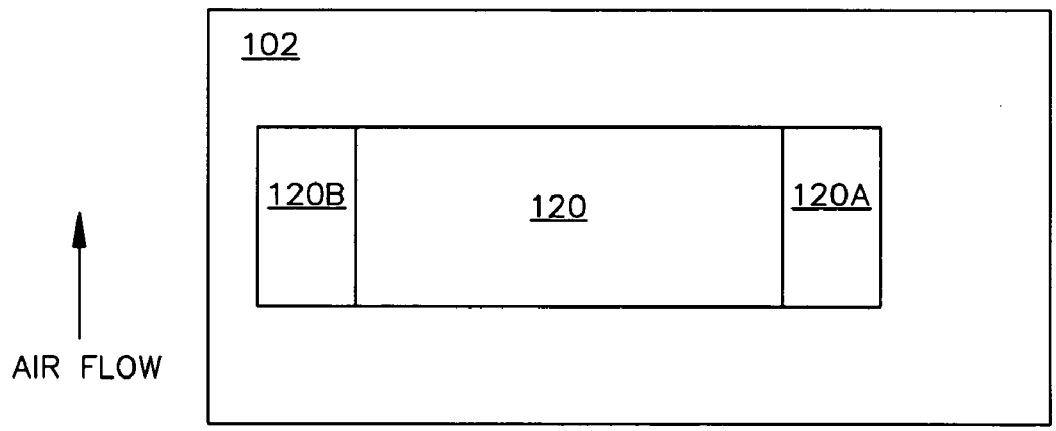
FIG. 4 is a top view of FIG. 2.
Figure 5:
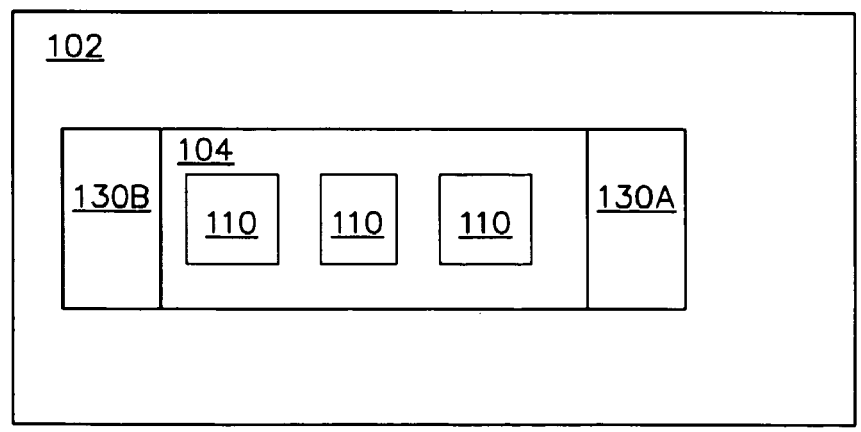
FIG. 5 is a top view of the FIG. 2 with the thermal dissipation devices removed from the electronic assembly.

For purposes of illustration only, the electronic assembly 100 is shown with an airflow direction as indicated with arrows in FIGS. 2-4 (the airflow being into the page and indicated with a circle and "X" in FIG. 2). The airflow can be provided, for example, with a fan or other device positioned within the electronic assembly 100 or within any one of the thermal dissipation devices, such as thermal dissipation device 120. The airflow is directed in a pathway that is parallel to the PCBs 102 and 104. A primary airflow is directed at and/or above the PCB 104. This primary airflow is directed at the thermal dissipating device 120, the power systems 130A, 130B, and the heat-generating components 110. Thus, the same airflow can be used to cool or dissipate heat simultaneously from the thermal dissipating device 120, the power systems 130A, 130B, and heat-generating components 110.

Figure 6:
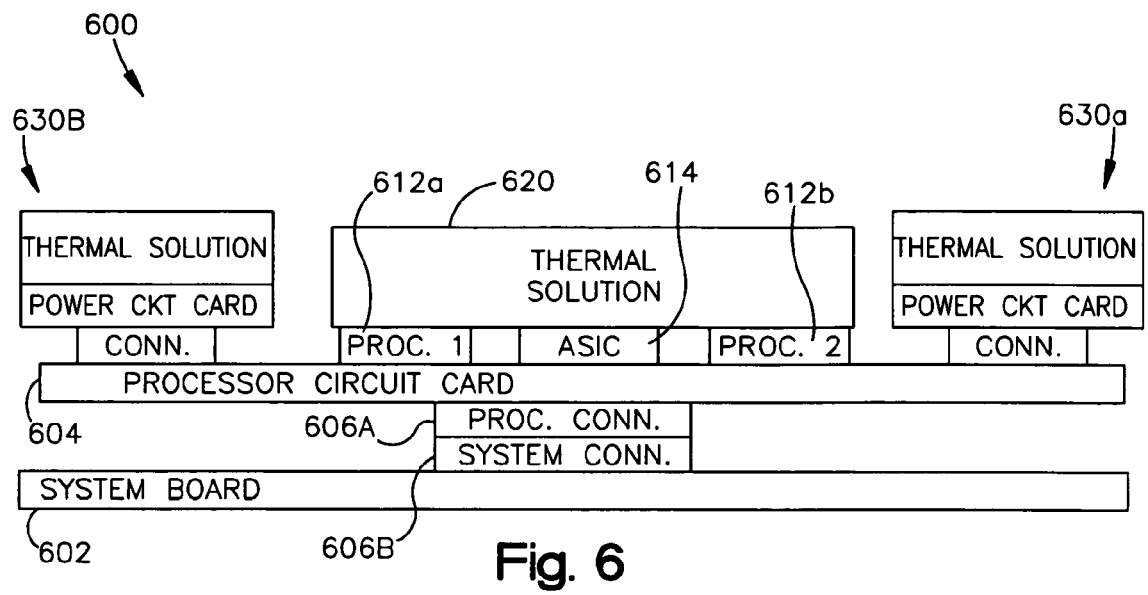
FIG. 6 is a side view of an exemplary embodiment of an electronic assembly.

Various different electronic components and PCBs can be combined into embodiments in accordance with the invention. FIG. 6 illustrates one such exemplary embodiment as electronic assembly 600. In this figure, a system board 602 connects to a processor circuit card 604 with a processor connector 606A and a system connector 606B. The processor circuit card 604 includes a plurality of processors, memories, and ASICs. Together, the plural processors, ASICs, memories, and thermal dissipation device can be connected to form a multi-processor module. For example, the processor circuit card 604 can have at least two processors 612A and 612B and an ASIC 614. A thermal dissipation device 620 is positioned directly above the processor circuit card 604 to cool and dissipate heat, via direct heat exchange, for the processors 612A, 612B and ASIC 614. Two power modules 630A, 630B are located at opposite ends of the processor circuit card 604. Each power module 630A, 630B includes a power circuit card (including power converters) and a thermal dissipation device (shown as thermal solution). An electrical connector connects each power module 630A, 630B to the processor circuit card 604.

Figure 7:
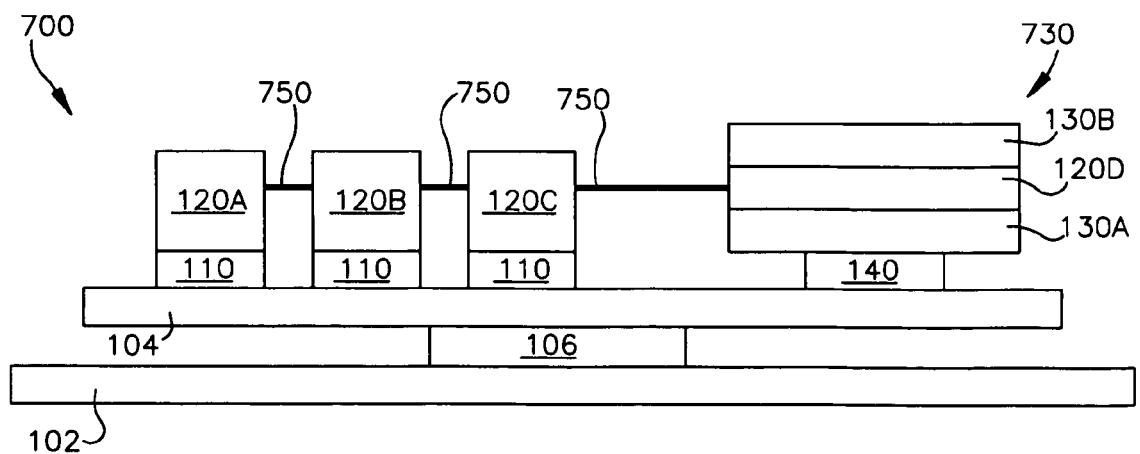
FIG. 7 is a side view of another exemplary embodiment of an electronic assembly.

FIG. 7 shows another exemplary electronic assembly 700 in accordance with an embodiment of the present invention. The electronic assembly 700 is generally similar to the electronic assembly 100 shown in FIGS. 2-5, and like reference numerals are used in FIG. 7. As one difference, each heat-generating component 110 includes its own separate thermal dissipation device, shown as 120A, 120B, and 120C. Further, the electronic assembly 700 includes a power module 730 connected, via connector 140, to PCB 104. The power module 730 comprises redundant power supplies and includes a vertically stacked-up configuration of two separate power systems 130A, 130B. A thermal dissipation device 120D is sandwiched between the two power systems 130A, 130B and is used to cool and dissipate heat simultaneously away from both power systems.

The thermal dissipation devices can utilize and/or comprise a remote heat exchanger (RHE). An RHE enables the thermal dissipation device to be remote from the heat-generating device (such as PCB 104, heat-generating components 110, and/or power system 130). For example, heat can be transferred from the heat-generating device to an attachment block having a heat pipe. Further, the heat pipe can be integral to the module or any portion of the electronic system (example, the thermal dissipation device) and extend outwardly from the electronic system to a remote heatsink. Alternatively, the heat pipe can attach to a surface of the module or system (example a surface of a thermal dissipation device) and then extend to a remote heatsink. The heat pipe, for instance, can be a hollow copper pipe containing a fluid and wicking material. Through a process of vaporization and re-condensation, heat travels through the heat pipe to a heat exchanger, such as a finned heat sink. Localized airflow can be used to evacuate the heat to the environment.

In all embodiments in accordance with the invention, one or more thermal dissipation devices could be or could utilize a cold-plate and/or could utilize beat dissipation via heat pipes or liquids. For example, looking to FIG. 8, the "In" and "Out" arrows signify liquid-in and liquid-out, respectively, and can be utilized with one or more thermal dissipation devices. As such, the thermal dissipation devices can be coupled to a pump and/or a heat exchanger to circulate a cooling liquid through the thermal solution to cool any one or combination of PCBs, heat-generating components, power system, etc. The thermal dissipation devices can be utilized in conjunction with one or both of the heat conduction and/or airflow cooling techniques discussed herein. As one example, the thermal dissipation devices can include a separate piece or unit on a top or bottom surface. This separate piece could be a liquid cold plate, evaporator, refrigerator, heatsink, or other device or technology known in the art.

Embodiments in accordance with the invention are not limited to any number or type of thermal dissipation devices. Further, separate thermal dissipation devices can be coupled together. For example, a liquid heat pipe (or other device known in the art) could extend from one thermal dissipation device to another thermal dissipation device. In FIG. 7, for example, a liquid heat pipe 750 could extend to and between each thermal dissipation device 120A, 120B, 120C, and 120D. The same heat pipe would assist in removing heat from each thermal dissipation device. Thereafter, the transferred heat could be dissipated in a variety of ways discussed herein, including but not limited to use of air, liquid cold plates, additional heat pipes, heat dissipation, remote heatsink, etc.

Figure 8:
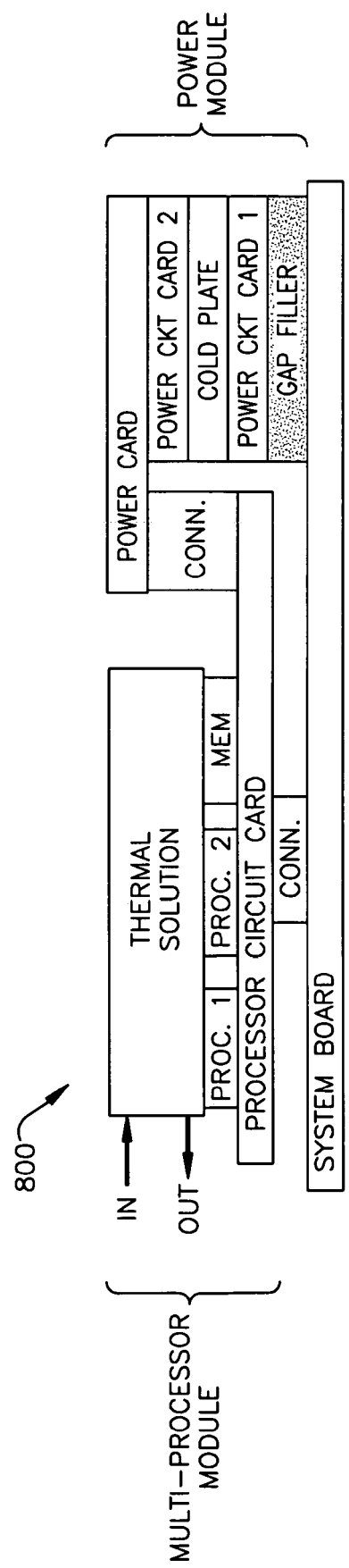
FIG. 8 is a side view of another exemplary embodiment of an electronic assembly.

Various different electronic components, layers, and PCBs can be combined into different embodiments in accordance with the invention. FIG. 8 illustrates one such exemplary embodiment as electronic assembly 800. In this figure, a system board is connected, via a connector, to a processor circuit card. The processor circuit card has a plurality of heat-generating components, such as plural processors (Proc 1 and Proc 2) and memory. A single thermal dissipation device (shown as thermal solution with "In" and "Out" arrows) extends above the heat-generating components. Heat is conducted, via direct heat exchange, directly from the heat-generating components to the thermal solution and then evacuated (via heat pipes, for example) from the thermal solution. Together, the processor circuit card, heat-generating components, and thermal solution comprise a multi-processor module that is removably connectable to the system board.

In FIG. 8, a power module is coupled to one end, via a connector, to the processor circuit card. The power module comprises redundant power supplies and includes two separate power circuit cards, a cold plate, and a power card coupled to the processor circuit card. A gap filler is disposed between one side of one power circuit card and the system board. The cold plate is disposed or sandwiched between the power circuit cards. The power card is disposed above and along the second power circuit cards and is connected, via the connector, to the processor circuit card. The redundant power module comprises a vertical stacked-up configuration of the two separate power circuit cards.

Figure 9A:
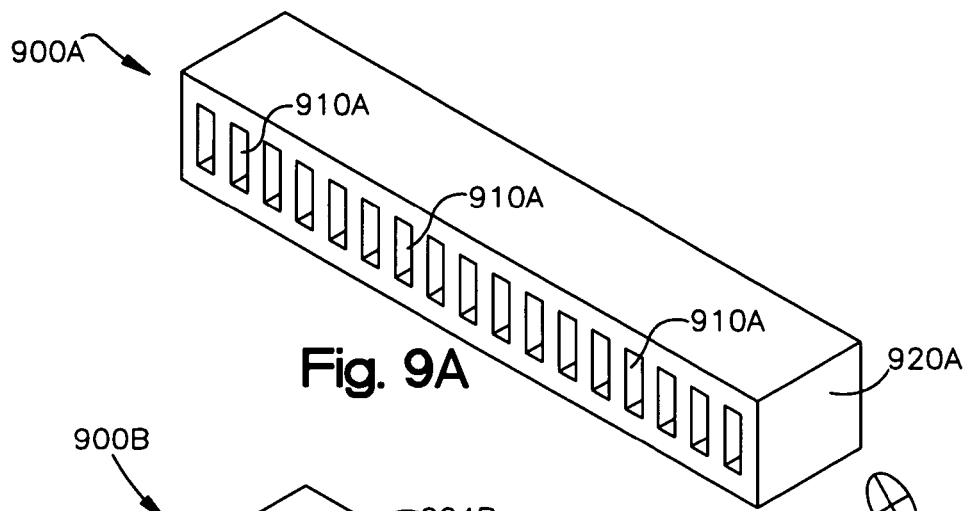
FIG. 9A is an exemplary embodiment of a thermal dissipation device.
Figure 9B:
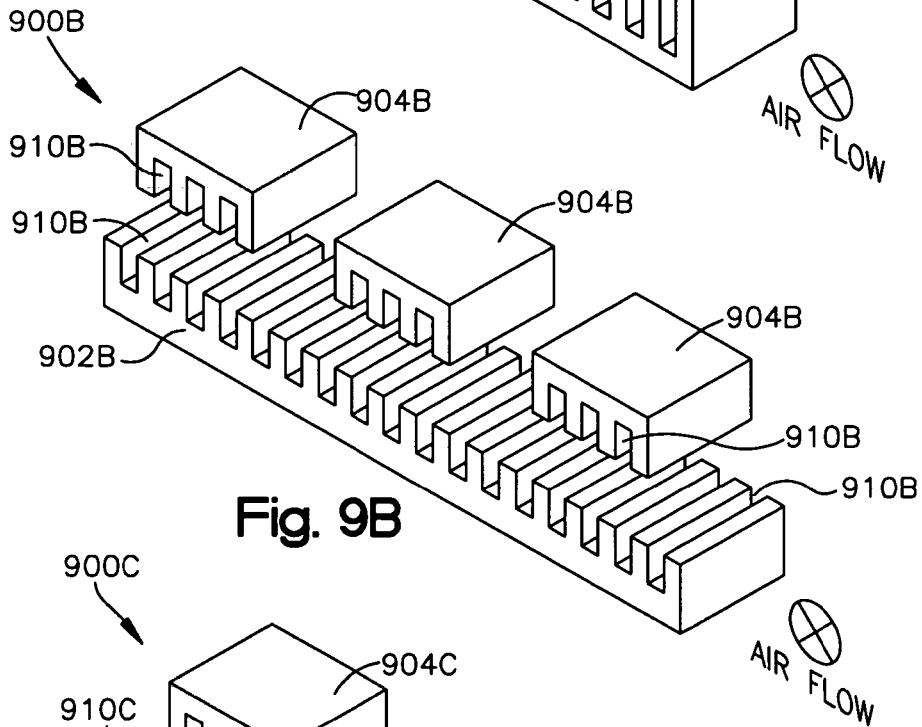
FIG. 9B is another exemplary embodiment of a thermal dissipation device.
Figure 9C:
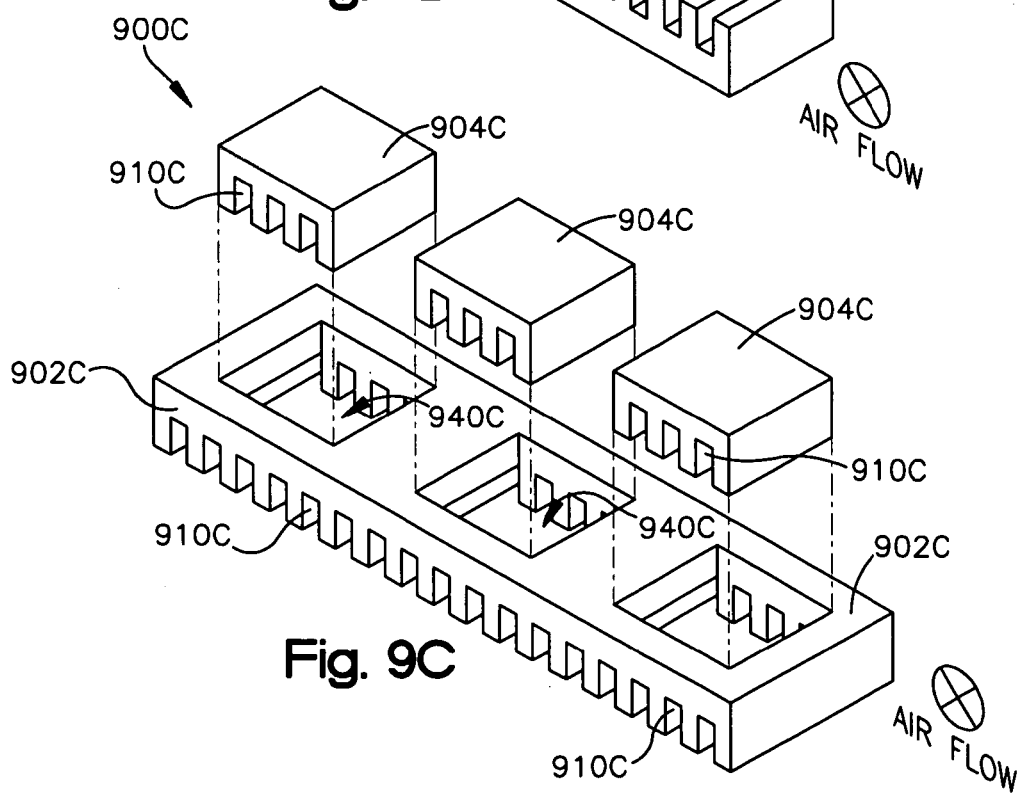
FIG. 9C is another exemplary embodiment of a thermal dissipation device.

As noted, the thermal dissipation devices in accordance with the present invention can comprise multiple different, separate members or a unitary or single member and utilize a wide variety of types of thermal dissipation devices. Some examples of additional various embodiments that can be utilized in conjunction with the electronic assembly are shown in FIGS. 9A to 9C. These examples illustrate a single airflow, but multiple airflows with various directions are within embodiments in accordance with the invention.

FIG. 9A shows a thermal dissipation device 900A having a plurality of openings 910A that extend through a body portion 920A. The openings 910A can have a variety of configurations and/or shapes and include slots, holes, etc. and can be formed from adjacent pins, rods, fins, etc. The openings 910A enable an airflow (the airflow being into the page and indicated with a circle and "X") to pass through the thermal dissipation device 900A.

FIG. 9B shows another example of a thermal dissipation device 900B formed from a base component 902B and a plurality of other separate components 904B. The base and separate components have a plurality of openings 910B. The openings 910B can have a variety of configurations and/or shapes and include slots, holes, etc. and can be formed from adjacent pins, rods, fins, etc. The openings 910B enable an airflow (the airflow being into the page and indicated with a circle and "X") to pass through the thermal dissipation device 900B.

FIG. 9C shows another example of a thermal dissipation device 900C formed from a base component 902C and a plurality of other separate components 904C. The base and separate components have a plurality of openings 910C. The separate components 904C are separate and removable from the base portion 902C and extend through holes or openings 940C in the base portion 902C. The openings 910C can have a variety of configurations and/or shapes and include slots, holes, etc. and can be formed from adjacent pins, rods, fins, etc. The openings 910C enable an airflow (the airflow being into the page and indicated with a circle and "X") to pass through the thermal dissipation device 900C.

As used herein, the term "module" means a unit, package, or functional assembly of electronic components for use with other electronic assemblies or electronic components. A module may be an independently-operable unit that is part of a total or larger electronic structure or device. Further, the module may be independently connectable and independently removable from the total or larger electronic structure.

Embodiments in accordance with the present invention can utilize a variety of modules. As an example, looking to FIG. 2, the PCB 104 can be a multi-processor module that includes heat-generating components 110 (such as two separate processors, an ASIC, and memory all on the same board or card). As another example, the multi-processor module does need to include the PCB 104 but removably connects to the PCB 104. As another example, the two separate power modules can be disposed adjacent each other and connect together via connectors. Once connected, the two power modules can form a single, larger power module with redundant power. The two separate power modules can be removably connected to each other. As yet another example, the processor module and power module can be connected together to form a power/processor module.

Further, embodiments in accordance with the present invention can utilize a modular connective architecture. If a particular electronic component (including PCBs) or device fails or otherwise needs to be replaced, the electronic component can be removed from the electronic assembly and replaced with a new and/or different component. As such, the electronic assemblies can be constructed with standardized electronic components and/or dimensions to enable flexibility and variety of use and exchange of components. Looking to FIG. 6 as an example, if power module 630A fails or needs to be replaced, the power module 630A can be disconnected or uncoupled and removed from the electronic assembly 600 while the processor circuit card 604 remains mechanically and electrically connected to the system board 602. A new and/or different power module can thereafter be connected to the processor circuit card 604 and utilized with the electronic assembly 600. While power module 630A is failed or removed from the electronic assembly 600, power module 630B provides sufficient power to the processor circuit card 604 so electronic components thereon can normally operate.

In order to facilitate modularity within the electronic assembly, various removable connections between electronic components can be utilized. By way of example, such connections include, but are not limited to, land grid arrays (LGAs), pin grid arrays (PGAs), plugs (example, male), sockets (example, female), pins, connectors, soldering, or other removable or disconnectable attachments.

Embodiments in accordance with the invention are not limited to two power systems/modules, a single PCB 104, or a single multi-processor module. For example, plural power systems can be stacked or arranged on a single PCB. For example, two, three, or more power modules can be vertically or horizontally stacked on a PCB. Such modules can be electrically and mechanically connected to each other. Further, plural PCBs can be stacked on arranged on each other or on another PCB. For example, the PCB 102 can include plural PCBs 104 stacked or arranged on PCB 102.

Further, the power system and/or power module can provide a power source that is proximally close to the load (example the PCB 104) in order to minimize noise and optimize step load performance. Furthermore, the power module includes all necessary electronic components to provide power to the heat-generating components.

The power module can have various configurations. For illustration purposes (as shown in FIGS. 6-8), the power module has a generally square or rectangular configuration. A top surface is formed from one outer surface of the thermal dissipation device, and an opposite bottom surface is formed from one outer surface of the power system, such as a power circuit card.

A module can include a variety of different heat exchanging or heat transferring interfaces (such as the interface between two thermal dissipation devices or the interface between a thermal dissipation and a PCB or a heat-generating component or the interface between two power modules or components within a power module). These interfaces can be adapted to enhance heat conduction or heat exchange. For example, the interfaces can include conductive resins, tapes, adhesives, gap pads, greases, or any other device or compound that facilitates or improves heat conduction.

Embodiments in accordance with the invention can be utilized in a wide variety of different methods and embodiments. For example, embodiments in accordance with the present invention can utilize embodiments taught in U.S. patent application Ser. No. 10/800,837 filed Mar. 15, 2004, entitled "Multi-Processor Module" and incorporated herein by reference. As another example, an exemplary method can comprise connecting plural heat-generating components to a first circuit board. The heat-generating components can include plural processors, ASICs, memories, and other electronic devices. The first circuit board can be connected to a second circuit board in a vertical or horizontal stacked-up configuration to create a space between the first and second circuit boards. Plural power systems or power modules can be connected to the first circuit board. The power modules supply redundant power to the plural heat-generating components of the first circuit board. Further, the power modules can be vertically or horizontally stacked or adjacent each other or spaced apart from each other. Single or multiple thermal dissipation devices can thermally dissipate heat away from the heat-generating devices and the power systems. Further, at least one thermal dissipation device can generate a primary airflow path that is directed toward a thermal dissipation device, the heat-generating components, and/or the power systems.

One skilled in the art will appreciate that a discussion of various methods should not be construed as steps that must proceed in a particular order. Additional steps may be added, some steps removed, or the order of the steps altered or otherwise changed.

While the invention has been disclosed with respect to a limited number of embodiments, those skilled in the art will appreciate, upon reading this disclosure, numerous modifications and variations. It is intended that the appended claims cover such modifications and variations and fall within the true spirit and scope of the invention.

What is claimed is:

1. An electronic assembly, comprising:
   a first printed circuit board (PCB);
   a second PCB having at least two processors, the second PCB being coupled to and disposed above the first PCB;
   a thermal dissipation device for dissipating heat away from the processors; and
   first and second power modules for providing power to the second PCB and being separated and redundant power supplies such that upon failure of the first power module, the second power module can provide power for both power modules to the second PCB.

2. The electronic assembly of claim 1 wherein the first and second power modules each includes a separate thermal dissipation device.

3. The electronic assembly of claim 1 wherein the first and second power modules are located at opposite ends of the second PCB.

4. The electronic assembly of claim 1 wherein the first and second power modules are removable than and connectable to the second PCB while the first and second PCBs remain connected.

5. The electronic assembly of claim 1 wherein:
the first power module includes a first power circuit card and a first thermal dissipation device for dissipating heat from the first power circuit card;
the second power module includes a second power circuit card and a second thermal dissipation device for dissipating heat from the second power circuit card.

6. The electronic assembly of claim 1 wherein the first and second power modules are cooled with an airflow that is generated by the thermal dissipation device.

7. The electronic assembly of claim 1 wherein heat generated from the first and second power modules transfers from the first and second power modules to the thermal dissipation device.

8. A method, comprising:
connecting first and second power systems to a first thermal dissipation device to form a power module;
connecting plural processors and a second thermal dissipation device to a first circuit board to form a multi-processor module;
connecting the multi-processor module and the power module to a second circuit board;
generating redundant power to the multi-processor module from the power module such that the first power system provides sufficient power to the multi-processor module upon failure of the second power system; and
dissipating heat away from both the first and second power systems with the first thermal dissipation device.

9. The method of claim 8 further comprising disposing the first thermal dissipation device between the first and second power systems.

10. The method of claim 8 comprising dissipating heat, via direct heat exchange, away from the plural processors to the second thermal dissipation device.

11. The method of claim 8 further comprising vertically stacking the first and second power systems and first thermal dissipation device to form the power module.

12. The method of claim 8 further comprising disconnecting the second power system from the power module while continuously supplying power via the first power system to the mult-processor module.

13. The method of claim 8 further comprising transferring heat from the first thermal dissipation device to the second thermal dissipation device.

14. The method of claim 8 further comprising:
disconnecting at least one power system from the power module without disconnecting the power module from the second circuit board;
connecting a different power system to the power module while the power module remains connected to the second circuit board.

15. An electronic assembly, comprising:
first and second printed circuit boards (PCBs) coupled in a stacked relationship, the first PCB having plural heat-generating components requiring assistance with heat dissipation;
at least two power modules coupled to at least one of the first and second PCBs, wherein each power module supplies redundant power to the first PCB and serves as a duplicate for preventing power supply failure to the first PCB upon failure of one of the power modules; and
a thermal dissipation device for dissipating heat away from the two power modules and for dissipating heat, via heat exchange, away from the plural heat-generating components.

16. The electronic assembly of claim 15 wherein the power modules have a rectangular configuration in a vertically stacked relationship.

17. The electronic assembly claim 15 wherein:
the plural heat-generating components include two processors disposed on the first PCB;
the two power modules are arranged in a horizontal stacked relationship coupled to the first PCB.

18. The electronic assembly of claim 15 wherein each power module comprises a thermal dissipation device for dissipating heat from its power module.

19. The electronic assembly of claim 15 wherein the two power modules can be uncoupled from and coupled to one of the PCBs while the first and second PCB remain coupled in the stacked relationship.

20. The electronic assembly of claim 15 wherein the thermal dissipation device generates an airflow toward the two power modules and toward the plural heat-generating components.

* * * * *

UNITED STATES PATENT AND TRADEMARK OFFICE
CERTIFICATE OF CORRECTION

PATENT NO.        : 7,280,365 B2
APPLICATION NO.   : 11/061156
DATED             : October 9, 2007
INVENTOR(S)       : Steven A. Belson et al.

It is certified that error appears in the above-identified patent and that said Letters Patent is hereby corrected as shown below:

In column 6, line 8, delete "12C" and insert -- $I^2C$ --, therefor.

In column 7, line 24, delete "beat" and insert -- heat --, therefor.

In column 10, line 65, in Claim 4, delete "than" and insert -- from --, therefor.

In column 11, line 32, in Claim 10, after "claim 8" insert -- further --.

In column 11, line 41, in Claim 12, delete "mult- processor" and insert -- multi- processor --, therefor.

In column 12, line 26, in Claim 17, after "assembly" insert -- of --.

In column 12, line 37, in Claim 19, after "second" delete "PCB" and insert -- PCBs --, therefor.

Signed and Sealed this

Twentieth Day of October, 2009

David J. Kappos
*Director of the United States Patent and Trademark Office*